United States Patent
Kim

(10) Patent No.: US 9,603,236 B2
(45) Date of Patent: Mar. 21, 2017

(54) HEAT DISSIPATING SUBSTRATE

(71) Applicant: SAMSUNG ELECTRO-MECHANICS CO., LTD., Suwon-Si (KR)

(72) Inventor: Hyoung Kim, Suwon-Si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 324 days.

(21) Appl. No.: 14/462,331

(22) Filed: Aug. 18, 2014

(65) Prior Publication Data

US 2016/0050792 A1 Feb. 18, 2016

(51) Int. Cl.
| F28F 7/00 | (2006.01) |
| H05K 1/02 | (2006.01) |
| H05K 3/42 | (2006.01) |
| H05K 3/46 | (2006.01) |

(52) U.S. Cl.
CPC ......... *H05K 1/0206* (2013.01); *H05K 1/0209* (2013.01); *H05K 3/429* (2013.01); *H05K 3/4679* (2013.01); *H05K 2201/0305* (2013.01); *H05K 2201/096* (2013.01); *H05K 2201/09536* (2013.01); *H05K 2201/09809* (2013.01)

(58) Field of Classification Search
CPC .... H05K 1/0206; H05K 1/0209; H05K 3/429; H05K 3/4679; H05K 2201/0305; H05K 2201/09536; H05K 2201/096; H05K 2201/09809
USPC ............... 165/185, 146, 147, 104.13, 104.15
See application file for complete search history.

(56) References Cited

U.S. PATENT DOCUMENTS

| 4,385,202 | A | * | 5/1983 | Spinelli | ............... | H01L 21/4857 |
| | | | | | | 174/252 |
| 4,574,879 | A | * | 3/1986 | DeGree | ................... | B32B 27/34 |
| | | | | | | 165/185 |
| 4,602,125 | A | * | 7/1986 | West | .................... | H01L 23/3737 |
| | | | | | | 165/185 |
| 5,414,224 | A | * | 5/1995 | Adasko | .................. | H05K 1/117 |
| | | | | | | 174/255 |
| 5,708,566 | A | * | 1/1998 | Hunninghaus | ....... | H05K 1/0206 |
| | | | | | | 174/252 |
| 6,490,161 | B1 | * | 12/2002 | Johnson | .............. | H01L 23/4006 |
| | | | | | | 165/185 |
| 2003/0110629 | A1 | * | 6/2003 | Horng | ................. | H01L 21/4857 |
| | | | | | | 29/854 |
| 2010/0006330 | A1 | * | 1/2010 | Fu | ......................... | H01L 21/486 |
| | | | | | | 174/260 |

FOREIGN PATENT DOCUMENTS

JP 2006-015279 1/2006

* cited by examiner

*Primary Examiner* — Justin Jonaitis
(74) *Attorney, Agent, or Firm* — NSIP Law

(57) ABSTRACT

There is provided a heat dissipating substrate including: a base substrate having a first through hole formed therein; a first substrate disposed on an upper end portion of the base substrate and including a second through hole having a diameter smaller than that of the first through hole; and a heat dissipating pad disposed on an upper end portion of the second through hole. In addition, a flow phenomenon of a thermal conduction member (lead) may be reduced using the thermal conduction member by forming a second through hole smaller than a first through hole.

9 Claims, 3 Drawing Sheets

HEAT DISSIPATING SUBSTRATE

BACKGROUND

The present disclosure relates to a heat dissipating substrate.

The present disclosure relates to a heat dissipating substrate. More particularly, the present disclosure relates to a heat dissipating substrate capable of efficiently dissipating heat generated from a component or a device having heating property, and a method of preventing a lead flow.

A printed circuit board has been widely used for all devices on which electronic devices and electronics circuits are mounted. That is, the electronics circuit is generally formed by using a plurality of manual electronic components such as a resistor, a capacitor, and the like and a plurality of active electronic components such as a transistor, a semiconductor integrated circuit IC, and the like, or a plurality of devices. Most of the electronic components or the devices generate heat depending on electricity conduction. Particularly, since the IC has a plurality of electronic components that are high-densely integrated, it generally involves heat generation. Therefore, the IC dissipates the heat using a heat dissipating unit such as a heat sink, or the like, and suppresses an increase in temperature.

The printed circuit board uses dielectric (or electrical insulator) such as a plastics resin, or the like as a base. However, particularly, in case of the electronics circuit having a large amount of heat generation and used under a high temperature environment, the printed circuit board taking account of heat dissipating property of a metal base, or the like is used.

The printed circuit board having improved heat dissipating property has been disclosed in several documents. A thermal conduction substrate formed by integrating an inorganic filler such as alumina, oxide of magnesium, or the like with thermosetting resin such as an epoxy resin, or the like, and a method of manufacturing the same have been disclosed. In addition, a multi-layer substrate having a metal layer, or the like having excellent heat conduction property filled or formed below a region on which the electronic component having heat generation property is mounted and directly dissipating the heat by the metal layer or by using a conductive layer of another place has been disclosed. In addition, a method of dissipating the heat generated from a heat generating component to the outside by forming a through hole below the heat generating component and using the through hole has been used.

According to Japanese Patent Laid-Open Publication No. 2006-15279, there was a problem that lead flows out in an opposite side of a substrate through a diameter of the through hole. In addition, since lead flows out in the opposite side to thereby interfere a flow of electricity, an electrical short circuit has occurred.

RELATED ART DOCUMENT (Patent Document 1) JP2006-15279 A

SUMMARY

An aspect of the present disclosure may provide a heat dissipating substrate capable of preventing a thermal conduction member (lead) from being flown in an opposite direction through a through hole.

An aspect of the present disclosure may also provide a heat dissipating substrate capable of improving reliability of a product by decreasing a flow phenomenon of a thermal conduction member (lead).

An aspect of the present disclosure may also provide a heat dissipating substrate usable even in an environment of a large amount of heat generation and high temperature.

According to an aspect of the present disclosure, a heat dissipating substrate may include: a base substrate having a first through hole formed in a thickness direction; a first substrate disposed on an upper end portion of the base substrate and having a second through hole connected to the first through hole; and a heat dissipating pad disposed on an upper end portion of the first substrate while being in contact with the second through hole.

The second through hole may have a diameter smaller than that of the first through hole.

The second through hole connected to the first through hole may have a diameter d1 of one side thereof smaller than a diameter d2 of the other side thereof.

The heat dissipating substrate may further include a second substrate disposed to be in contact with a lower end portion of the base substrate and having a third through hole connected to the first through hole.

The second through hole and the third through hole may have diameters smaller than those of the second through hole and the third through hole connected to the first through hole.

The diameters d1 and d3 of the second through hole and the third through hole connected to the first through hole may be formed to become large toward an outer side.

The diameter d3 of the third through hole connected to the first through hole may be smaller than the diameter of the second through hole connected to the first through hole.

The heat dissipating substrate may further include a thermal conduction member disposed to be inserted into the first through hole, the second through hole, and the third through hole and discharging heat to the outside.

The thermal conduction member may be connected integrally within the first through hole, the second through hole, and the third through hole while being in contact with the first through hole, the second through hole, and the third through hole.

One or more second through holes discharging heat to outside while being in contact with the heat dissipating pad may be formed, and the first through hole and the third through hole may be formed to correspond to the second through hole.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
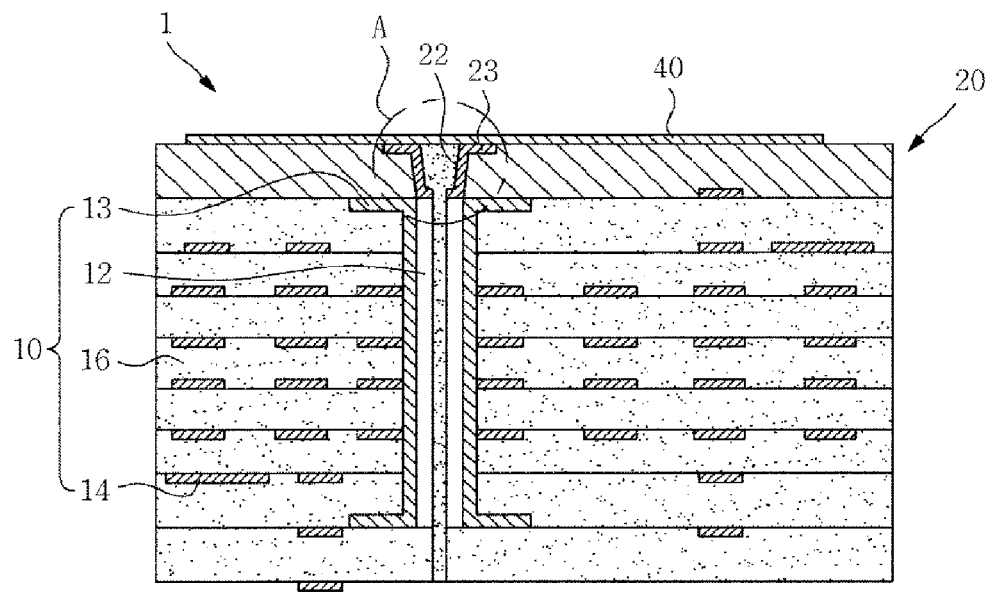
FIG. 1 is a cross-sectional view of a heat dissipating substrate according to an exemplary embodiment of the present disclosure.

The objects, features and advantages of the present disclosure will be more clearly understood from the following detailed description of the exemplary embodiments taken in conjunction with the accompanying drawings. Throughout the accompanying drawings, the same reference numerals are used to designate the same or similar components, and redundant descriptions thereof are omitted. Further, in the following description, the terms "first," "second," "one side," "the other side" and the like are used to differentiate a certain component from other components, but the configuration of such components should not be construed to be limited by the terms. Further, in the description of the present disclosure, when it is determined that the detailed description of the related art would obscure the gist of the present disclosure, the description thereof will be omitted.

Figure 2:
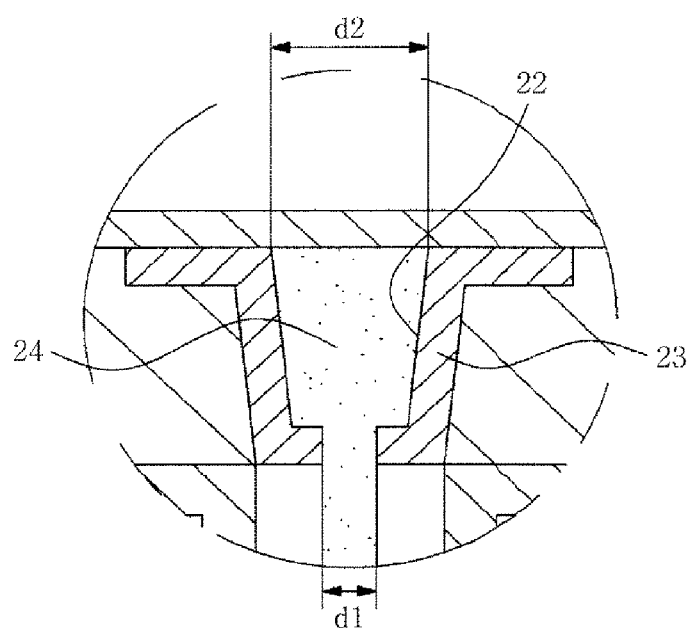
FIG. 2 is an enlarged view of the part A of FIG. 1.

Hereinafter, exemplary embodiments of the present disclosure will be described in detail with reference to the accompanying drawings. FIG. 1 is a cross-sectional view of a heat dissipating substrate according to an exemplary embodiment of the present disclosure and FIG. 2 is an enlarged view of the part A of FIG. 1.

Referring to FIG. 1, the heat dissipating substrate according to an exemplary embodiment of the present disclosure includes a base substrate 10 having a first through hole 12 formed therein, a first substrate 20 disposed on an upper end portion of the base substrate 10 and including a second through hole 22 having a diameter smaller than that of the first through hole 12, and a heat dissipating pad 40 disposed on an upper end portion of the second through hole.

The base substrate 10 has a metal layer 14 formed on a surface of an insulating layer 16. The base substrate 10 is formed by laminating a plurality of insulating layers 16. The base substrate 10 includes the first through hole 12 penetrating through the metal layer 14 and the insulating layers 16.

The base substrate 10 may be made of a complex polymer resin generally used as an interlayer insulating material. For example, a printed circuit board may be manufactured to be thinner by employing prepreg as the base substrate 10. A fine circuit may be easily implemented by employing an Ajinomoto build up film (ABF) as the base substrate 10. In some cases, the base substrate 10 is formed by laminating a single layer or a multi-layer insulating layer 16 and a plurality of metal layers 14.

The metal layer 14 may be made of any one selected from gold, silver, zinc, palladium, ruthenium, nickel, rhodium, an alloy of lead and tin, and an alloy of nickel and gold. Due to heat generated from the heat dissipating pad 40 to be described below, electrical malfunction of the metal layer 14 has occurred.

The insulating layer 16 may be made of a complex polymer resin generally used as an interlayer insulating material. For example, the insulating layer 16 may be made of a prepreg, Ajinomoto Build up Film (ABF), and an epoxy based resin such as FR-4, Bismaleimide Triazine (BT), or the like. In addition, the insulating layer 16 may have a form of a substrate or a film. However, in an exemplary embodiment of the present disclosure, a material and a form of the insulating layer 16 are not limited thereto.

The first through hole 12 may be formed to penetrate through both surfaces of the base substrate 10. In some cases, a plurality of first through holes 12 may be formed. The first through hole 12 may be formed by a physical method such as a CNC drill or a laser drill.

Referring to FIG. 2, the first substrate 20 is disposed on the upper end portion of the base substrate 10. The first substrate 20 is formed as the insulating layer and has the second through hole 22 formed therein. The second through hole 22 is disposed at the same position as the center of the first through hole 12. It is preferable that the second through hole 22 is formed to have a diameter smaller than that of the first through hole 12. In some cases, as the second through hole 22, a via hole having a diameter smaller than that of the first through hole 12 may be used. This is to prevent damage on a drill upon machining a diameter smaller than the first through hole. It is preferable that the second through hole 22 is formed in an inverted triangular shape.

The second through hole is formed so as to have a diameter d1 contacting the first through hole different from a diameter d2 contacting the heat dissipating pad. In this case, it is preferable that the diameter d2 is formed to be larger than the diameter d1. This is to easily inject the thermal conduction member.

The second through hole 22 has a plated layer 23 for conducting the heat formed on an outer peripheral surface thereof. It is preferable that the plated layer is formed so that the heat generated from the heat dissipating pad is dissipated to the outside through the first through hole 12. The second through hole 22 and the first through hole 12 may have the thermal conduction member 24 disposed therein in order to increase thermal conductivity.

The thermal conduction member 24 is disposed to be inserted into the first through hole 12. It is preferable that lead is used as the thermal conduction member 24. The thermal conduction member 24 is heated to be injected into the second through hole 22 and the first through hole 12. The thermal conduction member 24 passes through a surface mounting technology (SMT) (reflow soldering) so that it is injected in a liquid state. In this case, the thermal conduction member 24 in the liquid state injected into the second through hole 22 and the first through hole 12 is slowly solidified while flowing along an inner portion of the first through hole 12. The second through hole 22 also serves to adjust an injected amount of the thermal conduction member 24 injected into the first through hole 12 depending on the diameter of the second through hole 22. The thermal conduction member 24 is slowly solidified in the first through hole 22. This blocks in advance an occurrence of electrical short circuit occurred by the thermal conduction member 24 that is flown out in an opposite direction. In addition, the heat from the heat dissipating pad 40 contacting the second through hole 22 is dissipated to the outside, thereby preventing the malfunction of the IC chip. That is, reliability of the product is protected and damages on the heat dissipating pad 40, the IC chip, and other electronic components are prevented.

The heat dissipating pad 40 quickly discharges the heat to the outside so that the IC chip is not malfunctioned due to the heat generated from an inner portion of a device when the IC chip is operated. The heat dissipating pad 40 is made of aluminum or a metal material. The heat dissipating pad 40 may have a plurality of predetermined patterns that are repeatedly disposed at a constant interval and have a large area.

Figure 3:
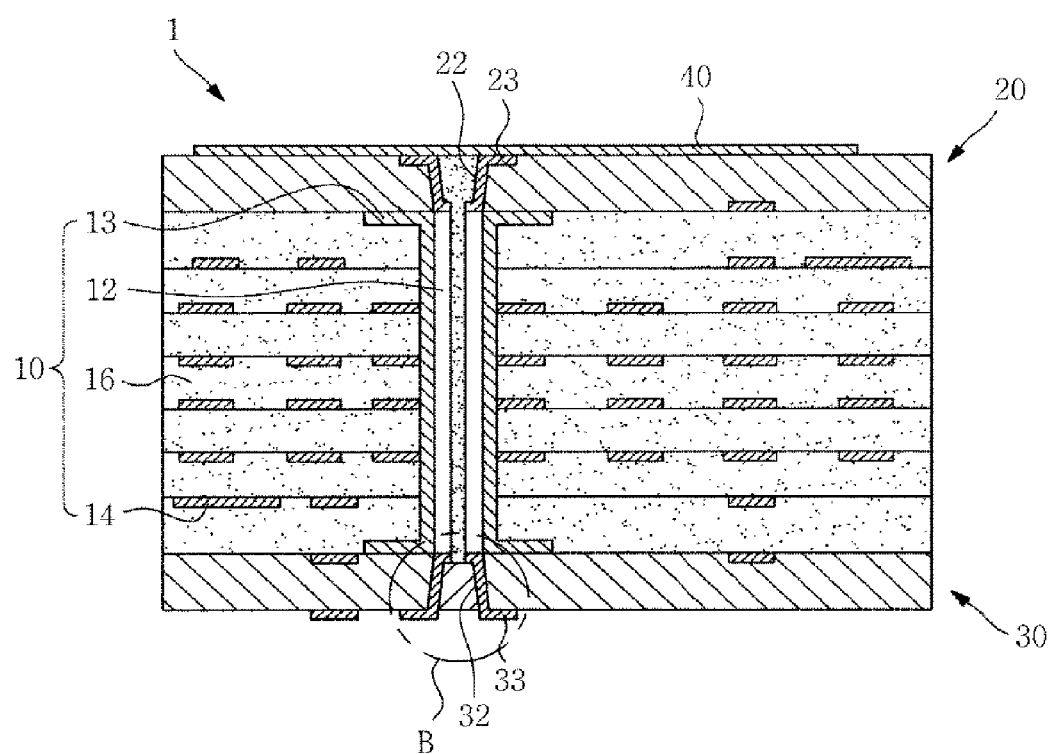
FIG. 3 is a cross-sectional view of a heat dissipating substrate according to a second exemplary embodiment of the present disclosure.

Referring to FIG. 3, a heat dissipating substrate according to a second exemplary embodiment of the present disclosure includes a base substrate 10 having a first through hole 12 formed therein, a second substrate 30 disposed on an upper end portion of the base substrate 10 and including a third through hole 32 having a diameter smaller than that of the first through hole 12, a heat dissipating pad 40 disposed on an upper end portion of the second through hole, and a second substrate 30 disposed on a lower end portion of the base substrate 10.

The description of the first through hole 12, the first substrate 20, the second through hole 22, and the heat dissipating pad 40 that are the same configuration as an exemplary embodiment of the present disclosure will be omitted.

Figure 4:
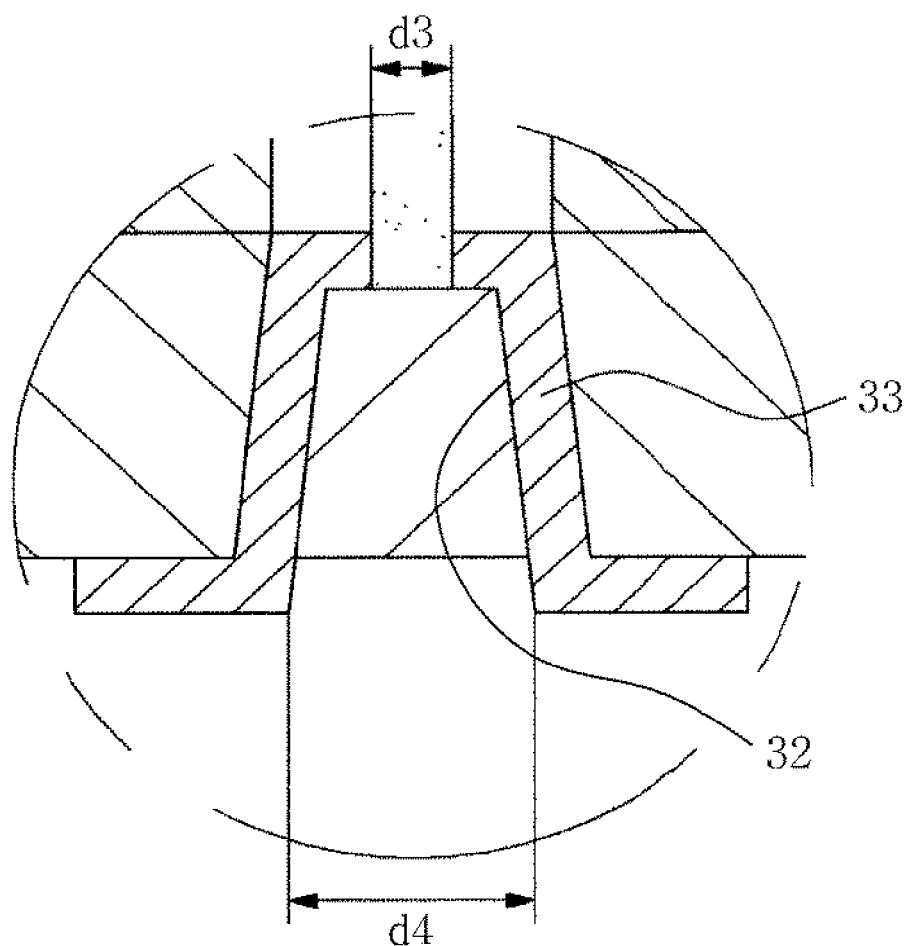
FIG. 4 is an enlarged view of the part B of FIG. 2.

Describing the second substrate that is a different technical characteristic between an exemplary embodiment and the second exemplary embodiment of the present disclosure with reference to FIG. 4, the heat dissipating substrate according to the second exemplary embodiment of the present disclosure includes a base substrate having a first through hole formed in a thickness direction therein, a first substrate disposed on an upper end portion of the base substrate and having a second through hole connected to the first through hole, a heat dissipating pad disposed on an upper end portion of the first substrate while being in contact with the second through hole, and a second substrate disposed to be in contact with a lower end portion of the base substrate and having a third through hole connected to the first through hole.

The second substrate 30 is disposed on the lower end portion of the base substrate 10. The second substrate 30 is formed as the insulating layer having a metal layer formed thereon and has the third through hole 32 formed therein. The third through hole 32 is disposed at the same position as the center of the first through hole 12. It is preferable that the third through hole 32 is formed to have a diameter smaller than that of the first through hole 12.

The third through hole 32 is formed to have a diameter d3 connected to the first through hole and a diameter d4 exposed to the outside that are different from each other. In this case, it is preferable that the diameter d3 of the third through hole 32 connected to the first through hole 12 is formed to be smaller than the diameter d1 of the second through hole 22 connected to the first through hole 12. This is to decrease an amount of thermal conduction member flowing out the third through hole 32 due to the second through hole 22 and the first through hole 12 connected to each other.

It is preferable that the third through hole 32 is formed to have the diameter d3 equal to or smaller than the diameter d2 of the second through hole 22. The third through hole 32 may be formed to be connected to a plurality of first through holes 12. This is to quickly discharge the heat from the heat dissipating pad 40 to the outside.

As set forth above, according to exemplary embodiments of the present disclosure, the second through hole smaller than the first through hole is formed, such that the flow phenomenon of the thermal conduction member (lead) may be decreased using the thermal conduction member.

In addition, the flow phenomenon of the thermal conduction member (lead) is decreased, such that an electrical short phenomenon occurred on an opposite surface due to the flow phenomenon may be suppressed.

In addition, the electrical short circuit is suppressed, such that malfunction of the component is prevented, thereby making it possible to improve reliability of a product.

In addition, the heat generated from the heat dissipating pad may be discharged to the outside through the thermal conduction member.

In addition, the via hole smaller than the first through hole is used, such that the damage on a drill bit that may be generated upon being manufactured may be prevented.

In addition, the heat dissipating substrate usable even in the environment of a large amount of heat generation and high temperature may be provided.

In addition, a detachment phenomenon of the component upon performing external impact and drop tests may be prevented by preventing an insufficient lead phenomenon of the thermal conduction member (lead).

In addition, warpage of the substrate (ground plane) due to heat generation may be prevented.

Although the embodiments of the present disclosure have been disclosed for illustrative purposes, it will be appreciated that the present disclosure is not limited thereto, and those skilled in the art will appreciate that various modifications, additions and substitutions are possible, without departing from the scope and spirit of the disclosure.

Accordingly, any and all modifications, variations or equivalent arrangements should be considered to be within the scope of the disclosure, and the detailed scope of the disclosure will be disclosed by the accompanying claims.

What is claimed is:

1. A heat dissipating substrate comprising:
   a base substrate;
   a first plated layer penetrating the base substrate in a thickness direction of the base substrate and having a first through hole formed therein in a thickness direction of the base substrate;
   a first substrate disposed on an upper end portion of the base substrate;
   a second plated layer penetrating the first substrate in a thickness direction of the first substrate and having a second through hole formed therein in a thickness direction of the first substrate;
   a heat dissipating pad disposed on an upper end portion of the first substrate to cover an upper end of the second plated layer; and
   a thermal conduction member comprising lead (Pb) and inserted into the first through hole and the second through hole to discharge heat to an outside,
   wherein the second through hole is connected to the first through hole and has a diameter smaller than that of the first through hole.

2. The heat dissipating substrate of claim 1, wherein a diameter d1 of an end portion of the second through hole connected to the first through hole is smaller than a diameter d2 of an opposite end portion of the second through hole.

3. The heat dissipating substrate of claim 1, further comprising:
   a second substrate disposed to be in contact with a lower end portion of the base substrate;
   a third plated layer penetrating the second substrate and having a third through hole formed therein in a thickness direction of the second substrate,
   wherein the third through hole is connected to the first through hole.

4. The heat dissipating substrate of claim 3, wherein diameters of end portions of the second through hole and the third through hole are different from diameters of opposite end portions of the second through hole and the third through hole.

5. The heat dissipating substrate of claim 4, wherein diameters d1 and d3 of the second through hole and the third through hole are formed to become large toward an outer side.

6. The heat dissipating substrate of claim 5, wherein the diameter d3 of the end portion of the third through hole connected to the first through hole is smaller than the diameter d1 of the end portion of the second through hole connected to the first through hole.

7. The heat dissipating substrate of claim 5, wherein further the thermal conduction member is further inserted into the third through hole.

8. The heat dissipating substrate of claim 7, wherein the thermal conduction member is integrally formed within the first through hole, the second through hole, and the third through hole and is at least partially in contact with at least one of the first plated layer, the second plated layer, and the third plated layer.

9. The heat dissipating substrate of claim 3, wherein one or more of the second plated layer is formed, and the first plated layer and the third plated layer are formed to correspond to the second plated layer.

* * * * *